(12) United States Patent
Jung et al.

(10) Patent No.: US 10,496,414 B2
(45) Date of Patent: Dec. 3, 2019

(54) SEMICONDUCTOR DEVICE AND METHOD OF OPERATING THE SAME

(71) Applicant: SK hynix Inc., Icheon-si, Gyeonggi-do (KR)

(72) Inventors: Chul Moon Jung, Icheon-si (KR); Joo Hyeon Lee, Bucheon-si (KR); Sung Nyou Yu, Seongnam-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 93 days.

(21) Appl. No.: 15/949,842

(22) Filed: Apr. 10, 2018

(65) Prior Publication Data
US 2019/0056956 A1 Feb. 21, 2019

(30) Foreign Application Priority Data

Aug. 21, 2017 (KR) .................. 10-2017-0105267

(51) Int. Cl.
| | | |
|---|---|---|
| G06F 9/44 | (2018.01) | |
| G11C 17/16 | (2006.01) | |
| G11C 17/18 | (2006.01) | |
| H03K 5/15 | (2006.01) | |
| H03K 21/38 | (2006.01) | |
| G06F 9/4401 | (2018.01) | |
| H03K 5/156 | (2006.01) | |
| H03K 5/00 | (2006.01) | |

(52) U.S. Cl.
CPC ............ *G06F 9/4401* (2013.01); *G11C 17/16* (2013.01); *G11C 17/18* (2013.01); *H03K 5/156* (2013.01); *H03K 21/38* (2013.01); *H03K 2005/00078* (2013.01)

(58) Field of Classification Search
CPC ....... G06F 9/4401; G11C 17/16; G11C 17/18; H03K 5/156; H03K 21/38
See application file for complete search history.

(56) References Cited

U.S. PATENT DOCUMENTS

| | | | | |
|---|---|---|---|---|
| 6,211,710 | B1 * | 4/2001 | Madhu | H03K 17/223 327/143 |
| 7,116,603 | B2 * | 10/2006 | Kanda | G11C 16/20 365/225.7 |
| 7,738,310 | B2 | 6/2010 | Naso et al. | |
| 9,036,445 | B1 * | 5/2015 | Shin | G11C 29/785 365/200 |
| 2009/0097330 | A1 * | 4/2009 | Yoko | G11C 7/1045 365/189.05 |

FOREIGN PATENT DOCUMENTS

KR 1020160041320 A 4/2016

* cited by examiner

*Primary Examiner* — Stefan Stoynov
(74) *Attorney, Agent, or Firm* — William Park & Associates Ltd.

(57) ABSTRACT

A semiconductor device may include a fuse array configured to output fuse data. The semiconductor device may include a latch circuit configured to store the fuse data during an enabled section of a dummy boot-up signal, output the stored fuse data as a fuse data information signal during a disabled section of the dummy boot-up signal, and fix the fuse data information signal to a specific level during the enabled section of the dummy boot-up signal regardless of the stored fuse data.

20 Claims, 5 Drawing Sheets

SEMICONDUCTOR DEVICE AND METHOD OF OPERATING THE SAME

CROSS-REFERENCES TO RELATED APPLICATION

The present application claims priority under 35 U.S.C. § 119(a) to Korean application number 10-2017-0105267, filed on Aug. 21, 2017, in the Korean Intellectual Property Office, which is incorporated herein by reference in its entirety.

BACKGROUND

1. Technical Field

Various embodiments may generally relate to a semiconductor integrated circuit, more particularly, to a semiconductor device and a method of operating the semiconductor device.

2. Related Art

A semiconductor device may include a fuse circuit. The fuse circuit may function as to save the semiconductor device when a fail is generated in the semiconductor device or to store operational information of the semiconductor device.

Semiconductor devices are more often than not required to have a relatively small size, to have low power consumption, and to provide a large capacity. To provide the small sizes, the low power consumption, and the larger capacities, the semiconductor devices often include more and more fuse circuits. However, including more fuse circuits may cause the semiconductor device to consume more power.

SUMMARY

In an embodiment, for example, a semiconductor device may be provided. The semiconductor memory device may include a boot-up signal generation circuit, an oscillating circuit, a counting circuit, a fuse array, and a latch circuit. The boot-up signal generation circuit may be configured to generate a boot-up signal based on a power-up signal and an end signal. The oscillating circuit may be configured to generate an oscillator signal periodically transited based on a dummy boot-up signal and the boot-up signal. The oscillating circuit may be configured to generate a delay oscillator signal generated by delaying the oscillator signal. The counting circuit may be configured to generate a counting address, the end signal, and the dummy boot-up signal based on the oscillator signal and the power-up signal. The fuse array may be configured to output fuse information as fuse data based on the counting address. The latch circuit may be configured to generate a fuse data information signal based on the delay oscillator signal and the fuse data.

In an embodiment, for example, a method of operating a semiconductor device may be provided. The method may include enabling a boot-up signal and a dummy boot-up signal based on a power-up signal being enabled. The method may include outputting fuse information from a fuse array, as fuse data, based on the boot-up signal being enabled. The method may include latching the fuse data before all of the fuse information in the fuse array as the fuse data is outputted. The method may include fixing a fuse data information signal to a specific level.

In an embodiment, for example, a semiconductor device may be provided. The semiconductor memory device may include a fuse array configured to output fuse data. The semiconductor device may include a latch circuit configured to store the fuse data during an enabled section of a dummy boot-up signal, output the stored fuse data as a fuse data information signal during a disabled section of the dummy boot-up signal, and fix the fuse data information signal to a specific level during the enabled section of the dummy boot-up signal regardless of the stored fuse data.

In an embodiment, for example, a method of operating a semiconductor device may be provided. The method may include outputting fuse information stored in a fuse array as fuse data during a boot up operation. The method may include latching the fuse data during the boot up operation for a first duration less than an entire duration of the boot up operation. The method may include fixing a fuse data information signal to a specific level instead of outputting the latched fuse data as the fuse data information signal for a second duration less than an entire duration of the boot up operation. The first duration may be different from the second duration. The first duration may not overlap in time with the second duration.

DETAILED DESCRIPTION

Various embodiments will be described below with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims.

The description is described herein with reference to cross-section and/or plan illustrations of idealized embodiments. However, embodiments of the description should not be construed as limiting the concepts. Although a few embodiments will be illustrated and described, it will be appreciated by those of ordinary skill in the art that changes may be made in these embodiments without departing from the principles and spirit of the embodiments. Further, the logic levels of the signals may be different from or the opposite of those described. For example, a signal described as having a logic "high" level may alternatively have a logic "low" level, and a signal described as having a logic "low"

level may alternatively have a logic "high" level. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

Examples of the embodiments may provide for a semiconductor device having low power consumption.

Examples of the embodiments may also provide for a method of operating the above-mentioned semiconductor device.

According to examples of the embodiments, a semiconductor device and the method of operation of the semiconductor device may be capable of reducing power consumption.

Figure 1:
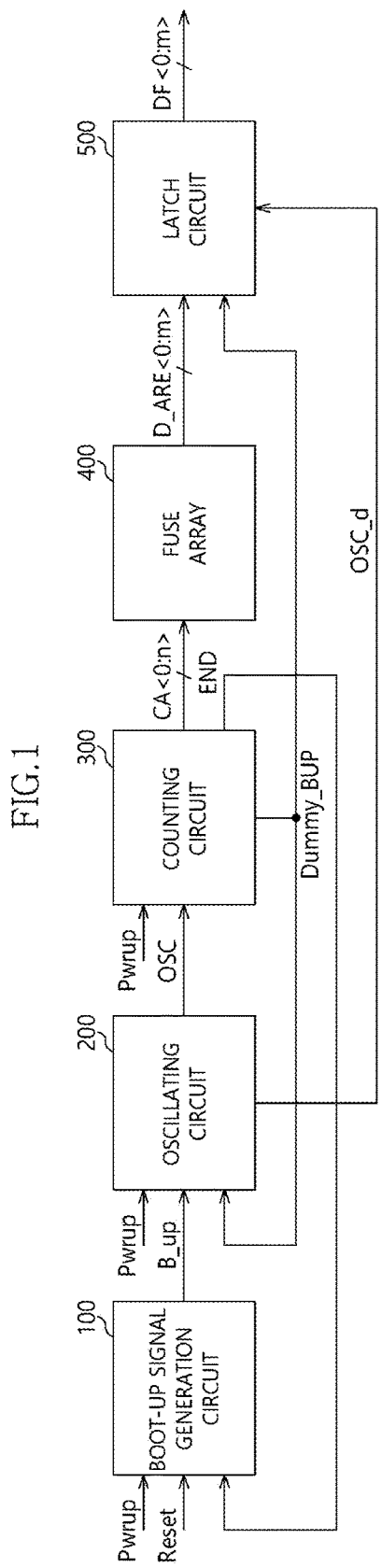
FIG. 1 is a block diagram illustrating a semiconductor device in accordance with examples of embodiments.

FIG. 1 is a block diagram illustrating a semiconductor device in accordance with an embodiment.

Referring to FIG. 1, in an embodiment, for example, a semiconductor device may include a boot-up signal generation circuit 100, an oscillating circuit 200, a counting circuit 300, a fuse array 400, and a latch circuit 500.

The boot-up signal generation circuit 100 may be configured to generate a boot-up signal B_up in response to a power-up signal Pwrup, a reset signal Reset, and an end signal END. For example, when the power-up signal Pwrup is enabled, the boot-up signal generation circuit 100 may enable the boot-up signal B_up. When the reset signal Reset and the end signal END are enabled, the boot-up signal generation circuit 100 may disable the boot-up signal B_up. The power-up signal Pwrup may correspond to a signal enabled when an external voltage in the semiconductor device is increased to a target level. That is, the power-up signal Pwrup may correspond to a signal enabled when the semiconductor device is normally operated by applying the external voltage to the inactive semiconductor device. The reset signal Reset may correspond to a signal generated when the semiconductor device is reset, i.e., initialized. In an embodiment, for example, the boot-up signal B_up may correspond to a signal generated when the semiconductor device is in a boot-up operation, i.e., an enabled boot-up signal B_up after enablement of the power-up signal Pwrup may indicate the semiconductor device is in a boot-up operation until the boot-up signal B_up is disabled.

The oscillating circuit 200 may be configured to generate an oscillator signal OSC periodically transited in response to the power-up signal Pwrup, the boot-up signal B_up and a dummy boot-up signal Dummy_BUP. For example, when the boot-up signal B_up is enabled after enabling the power-up signal Pwrup, the oscillating circuit 200 may generate the periodically transited oscillator signal OSC. The oscillating circuit 200 may change a period of the oscillator signal OSC in response to the dummy boot-up signal Dummy_BUP. For example, the oscillating circuit 200 may generate the oscillator signal OSC having a first frequency when the dummy boot-up signal is enabled. The oscillating circuit 200 may generate the oscillator signal OSC having a second frequency lower than the first frequency when the dummy boot-up signal Dummy_BUP may be disabled. Further, the oscillating circuit 200 may delay the oscillator signal OSC to generate a delay oscillator signal OSC_d.

The counting circuit 300 may be configured to generate a counting address CA<0:n>, the end signal END, and the dummy boot-up signal Dummy_BUP in response to the power-up signal Pwrup and the oscillator signal OSC. For example, after the power-up signal Pwrup is enabled, the counting circuit 300 may count the oscillator signal OSC to increase an address value of the counting address CA<0:n>. When the counting address CA<0:n> reaches a set maximum value, the counting circuit 300 may disable the dummy boot-up signal Dummy_BUP. Further, when the dummy boot-up signal Dummy_BUP is disabled, the counting circuit 300 may enable the end signal END.

The fuse array 400 may be configured to output fuse data D_ARE<0:m> in response to the counting address CA<0:n>. For example, the fuse array 400 may include a plurality of fuse cells corresponding to the counting address CA<0:n>. The fuse array 400 may output data values stored in the fuse cells, which may correspond to the counting address CA<0:n>, as the fuse data D_ARE<0:m>

The latch circuit 500 may be configured to output the fuse data D_ARE<0:m> as a fuse data information signal DF<0:m> in response to the dummy boot-up signal Dummy_BUP and the delay oscillator signal OSC_d. For example, when the dummy boot-up signal Dummy_BUP is enabled, the latch circuit 500 may fix the fuse data information signal DF<0:m> to a specific level. When the dummy boot-up signal Dummy_BUP is disabled, the latch circuit 500 may output the fuse data D_ARE<0:m> as the fuse data information signal DF<0:m>.

Figure 2:
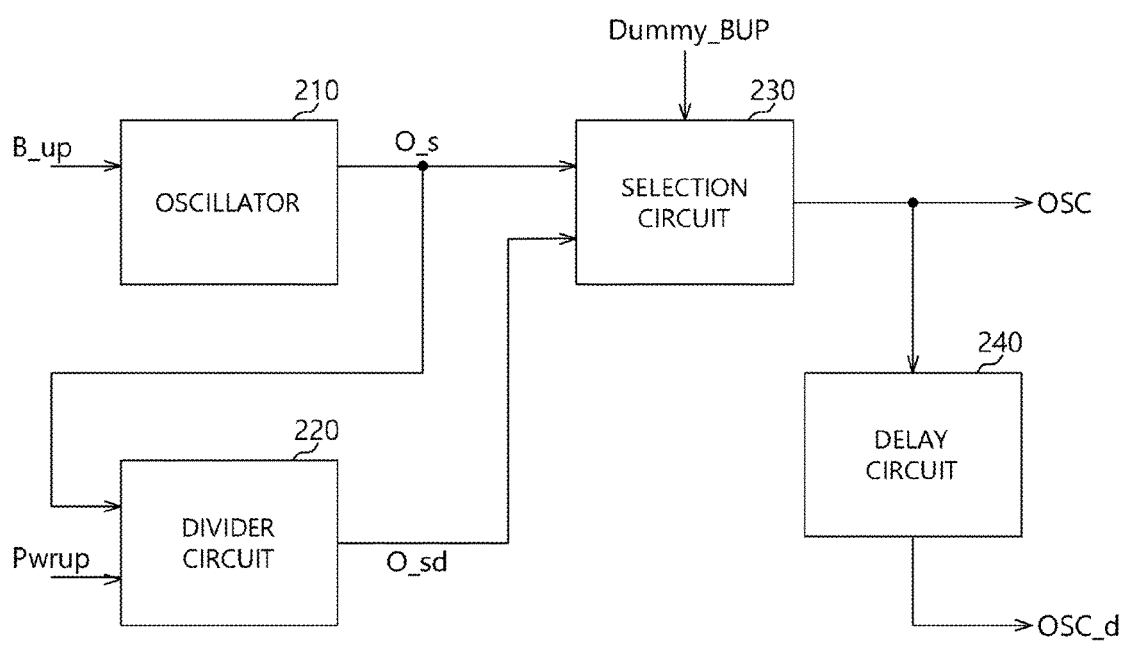
FIG. 2 is a block diagram illustrating an oscillating circuit in FIG. 1.

FIG. 2 is a block diagram illustrating an oscillating circuit in FIG. 1.

Referring to FIG. 2, the oscillating circuit 200 may include an oscillator 210, a divider circuit 220, a selection circuit 230 and a delay circuit 240.

The oscillator 210 may perform an oscillating operation in response to the boot-up signal B_up. The oscillator 210 may generate a period signal O_s periodically transited by the oscillating operation. For example, when the boot-up signal B_up is enabled, the oscillator 210 may generate the periodically transited period signal O_s.

The divider circuit 220 may generate a divider signal O_sd in response to the power-up signal Pwrup and the period signal O_s. After the power-up signal Pwrup is enabled, the divider circuit 220 may divide the period signal O_s to generate the divider signal O_sd. The divider circuit 220 may be embodied as a counter.

The selection circuit 230 may output any one of the period signal O_s and the divider signal O_sd as the oscillator signal OSC in response to the dummy boot-up signal Dummy_BUP. For example, when the dummy boot-up signal Dummy_BUP is enabled, the selection circuit 230 may output the period signal O_s as the oscillator signal OSC. When the dummy boot-up signal Dummy_BUP may be disabled, the selection circuit 230 may output the divider signal O_sd as the oscillator signal OSC. The selection circuit 230 may be embodied as a multiplexer.

The delay circuit 240 may delay the oscillator signal OSC to output the delay oscillator signal OSC_d. The delay circuit 240 may delay the oscillator signal OSC with a delay time, which may be from a responding time of the fuse array 400 in response to the counting address CA<0:n> to an output time of the fuse data D_ARE<0:m>, to output the delay oscillator signal OSC_d. The delay circuit 240 may be implemented with hardware, software, or any combination thereof.

When the boot-up signal B_up is enabled after enabling the power-up signal Pwrup, the oscillating circuit 200 may generate the oscillator signal OSC and the delay oscillator signal OSC_d. The oscillating circuit 200 may generate the oscillator signal OSC having the first frequency when the dummy boot-up signal is enabled. The oscillating circuit 200 may generate the oscillator signal OSC having the second frequency less than the first frequency when the dummy boot-up signal Dummy_BUP may be disabled.

Figure 3:
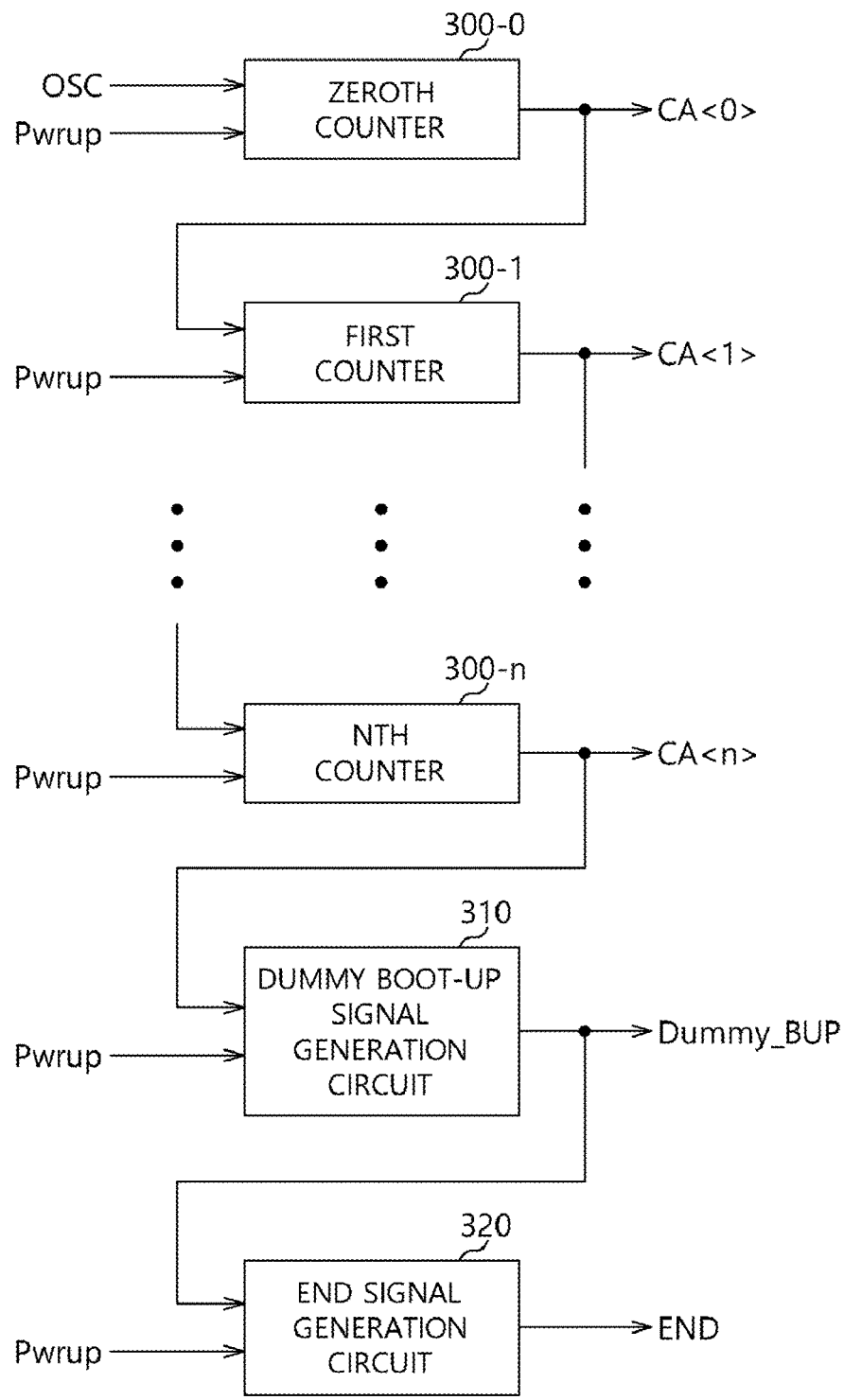
FIG. 3 is a block diagram illustrating a counting circuit in FIG. 1.

FIG. 3 is a block diagram illustrating a counting circuit in FIG. 1.

Referring to FIG. 3, the counting circuit 300 may include zeroth to nth counters 300-0~300-n, a dummy boot-up signal generation circuit 310 and an end signal generation circuit 320. In an embodiment, for example, the zeroth to nth counters 300-0~300-n may be serially connected with each other.

Each of the zeroth to nth counters 300-0~300-n may output a signal. Each of the zeroth to nth counters 300-0~300-n may transmit the output signal to a next counter. For example, the zeroth counter 300-0 may transmit the output signal to the first counter 300-1. Each of the zeroth to nth counters 300-0~300-n may be initialized in response to the power-up signal Pwrup. Each of the zeroth to nth counters 300-0~300-n may output a bit of each of the counting address CA<0:n>. Only the zeroth counter 300-0 may receive the oscillator signal OSC. When each of the zeroth to nth counters 300-0~300-n are initialized by the power-up signal Pwrup, each of the zeroth to nth counters 300-0~300-n may transit all of the bits of the counting address CA<0:n> to a specific level, i.e., a low level. The counters may be implemented with hardware, software, or any combination thereof.

The dummy boot-up signal generation circuit 310 may generate the dummy boot-up signal Dummy_BUP in response to the power-up signal Pwrup and any one bit of the counting address CA<0:n>, for example, the output signal of the nth counter 300-n. For example, when the power-up signal Pwrup is enabled, the dummy boot-up signal generation circuit 310 may output the dummy boot-up signal Dummy_BUP enabled to a high level. When the output signal CA<n> of the nth counter 300-n is transited to a specific level, for example, a high level, the dummy boot-up signal generation circuit 310 may disable the dummy boot-up signal Dummy_BUP to a low level. The dummy boot-up signal generation circuit 310 may be implemented with hardware, software, or any combination thereof.

The end signal generation circuit 320 may generate the end signal END in response to the power-up signal Pwrup and the dummy boot-up signal Dummy_BUP. For example, when the dummy boot-up signal Dummy_BUP is disabled after enabling the power-up signal Pwrup, the end signal generation circuit 320 may generate the end signal END enabled for a predetermined time. The end signal generation circuit 320 may be embodied as a pulse generation circuit.

When the power-up signal Pwrup is enabled, the counting circuit 300 may initialize the counting address CA<0:n> to an initial value (all bits: low). Whenever the oscillator signal OSC is transited to a specific level, for example, a high level, the counting circuit 300 may increase an address value of the counting address CA<0:n>. When the counting address CA<0:n> reaches a set value, that is, the specific counting address CA<n> among the counting address CA<0:n> is transited from the low level to the high level, the counting circuit 300 may disable the dummy boot-up signal Dummy_BUP, which may be enabled by the power-up signal Pwrup, to the low level. Further, when the dummy boot-up signal Dummy_BUP is disabled, the counting circuit 300 may generate the end signal END enabled for a predetermined time. In an embodiment, for example, the enabled section of the dummy boot-up signal Dummy_BUP is during a boot up operation of the semiconductor device and has a duration that may be less than a duration of the boot up operation. For example, in an embodiment, the enabled section of the dummy boot-up signal Dummy_BUP is during an enablement period of the boot-up signal B_up after enabling the power up signal Pwrup and has a duration that may be less than the enablement period of the boot-up signal B_up. For example, in an embodiment, the duration of the enabled dummy boot-up signal Dummy_BUP is defined by the time elapsed from when the counting circuit 300 initializes an address value of the counting circuit 300 in response to the power up signal Pwrup to when the initialized address value is increased to a specific counting address (i.e., when the counting address CA<0:n> reaches a set value). For example, in an embodiment, the duration of the enabled dummy boot-up signal Dummy_BUP is based on the time it takes the counting circuit 300 to count to a max value after being initialized by the power up signal Pwrup.

Figure 4:
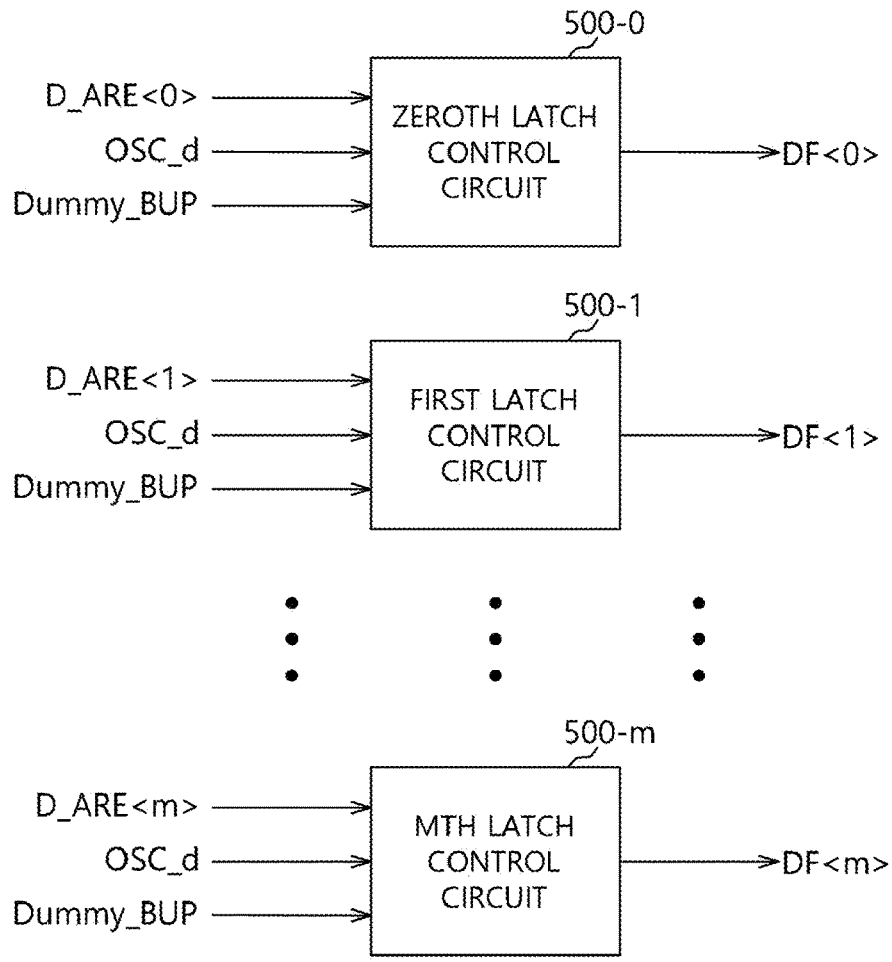
FIG. 4 is a block diagram illustrating a latch circuit in FIG. 1.
Figure 5:
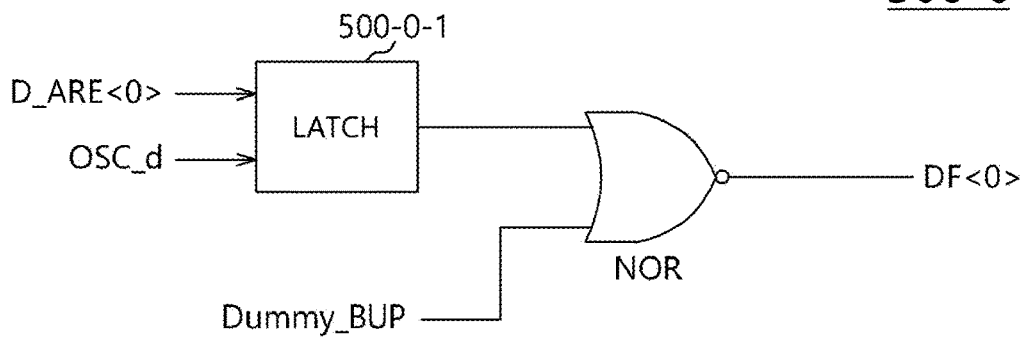
FIG. 5 is a block diagram illustrating a zeroth latch output circuit in FIG. 4.

FIG. 4 is a block diagram illustrating a latch circuit in FIG. 1, and FIG. 5 is a block diagram illustrating a zeroth latch output circuit in FIG. 4.

Referring to FIGS. 4 and 5, the latch circuit 500 may include zeroth to mth latch control circuits 500-0~500-m.

The zeroth to mth latch control circuits 500-0~500-m may output the fuse data information signal DF<0:m> in response to the dummy boot-up signal Dummy_BUP, the fuse data D_ARE<0:m> and the delay oscillator signal OSC_d. For example, the zeroth to mth latch control circuits 500-0~500-m may fix the fuse data information signal DF<0:m> to a specific level, i.e., a low level in an enabled section of the dummy boot-up signal Dummy_BUP regardless of the fuse data D_ARE<0:m> and the delay oscillator signal OSC_d. When the dummy boot-up signal Dummy_BUP is disabled, the zeroth to mth latch control circuits 500-0~500-m may synchronize the fuse data D_ARE<0:m> with the delay oscillator signal OSC_d. The zeroth to mth latch control circuits 500-0~500-m may output a latched signal as the fuse data information signal DF<0:m>. In an embodiment, for example, the fuse data D_ARE<0:m> may be latched in the latch circuit 500 before all of the fuse information in the fuse array 400 is outputted from the latch circuit 500.

The zeroth to mth latch control circuits 500-0~500-m may have substantially the same configuration except for input/output signals. Thus, for example, the configuration of the zeroth latch control circuit 500-0 is illustrated below. Any further illustrations with respect to the configurations of the first to mth latch control circuits 500-1~500-m may be omitted herein for brevity.

The zeroth latch control circuit 500-0 may include a latch 500-0-1 and a NOR logic operator, for example but not limited to, a NOR gate NOR. The latch 500-0-1 may latch the fuse data D_ARE<0> in response to the delay oscillator signal OSC_d. The NOR gate NOR may receive an output signal of the latch 500-0-1 and the dummy boot-up signal Dummy_BUP to output the fuse data information signal DF<0>.

The zeroth latch control circuit 500-0 may fix the fuse data information signal DF<0> to a low level in an enabled section of the dummy boot-up signal Dummy_BUP. The zeroth latch control circuit 500-0 may synchronize the fuse data information signal DF<0> with the delay oscillator signal OSC_d in a disabled section of the dummy boot-up signal Dummy_BUP by latching the fuse data D_ARE<0> in response to the delay oscillator signal OSC_d. The zeroth latch control circuit 500-0 may output the latched signal as the fuse data information signal DF<0>. The operations of the zeroth latch control circuit 500-0 may be substantially the same as those of the first to mth latch control circuit 500-1~500-m.

Hereinafter, operations of the semiconductor device are discussed below.

When the power-up signal Pwrup is enabled, the boot-up signal generation circuit 100 may enable the boot-up signal B_up.

When the power-up signal Pwrup is enabled, the counting circuit 300 may initialize the counting address CA<0:>. The counting circuit 300 may generate the enabled dummy boot-up signal Dummy_BUP.

The latch circuit 500 may fix the fuse data information signal DF<0:M> to a specific level, i.e., the low level during the enabled section of the dummy boot-up signal Dummy_BUP.

When the boot-up signal B_up is enabled, the oscillating circuit 200 may generate the periodically transited oscillator signal OSC. The oscillating circuit 200 may generate the oscillator signal OSC having the first frequency when the dummy boot-up signal Dummy_BUP is enabled. The oscillating circuit 200 may generate the oscillator signal OSC having the second frequency lower than the first frequency when the dummy boot-up signal Dummy_BUP is disabled.

When the periodically transited oscillator signal OSC is inputted into the counting circuit 300, the counting circuit 300 may increase the address value of the counting address CA<0:n>.

The fuse array 400 may output the fuse information corresponding to the address value of the counting address CA<0:n> as the fuse data D_ARE<0:m>.

When the fuse information of the fuse array 400 is outputted as the fuse data D_ARE<0:m>, that is, the address value of the counting address CA<0:n> reaches the set value, the counting circuit 300 may enable the end signal END and disable the dummy boot-up signal Dummy_BUP.

The latch circuit 500 may store the fuse data D_ARE<0:m> inputted in the enabled section of the dummy boot-up signal Dummy_BUP. The latch circuit 500 may fix the fuse data information signal DF<0:m> to the low level in the enabled section of the dummy boot-up signal Dummy_BUP regardless of the stored fuse data D_ARE<0:m>.

When the dummy boot-up signal Dummy_BUP is disabled, the latch circuit 500 may output the fuse data D_ARE<0:m> as the fuse data information signal DF<0:m>.

According to an example of an embodiment, when the output of the latch circuit 500 is fixed to the specific level before storing the information of the fuse array 400 in the latch circuit 500, the logical element may be arranged at an output node of the latch circuit 500, not connecting the output node of the latch circuit 500 with a ground terminal, to fix the output node to the specific level. Thus, the semiconductor device may have a relatively lower power consumption.

Figure 6:
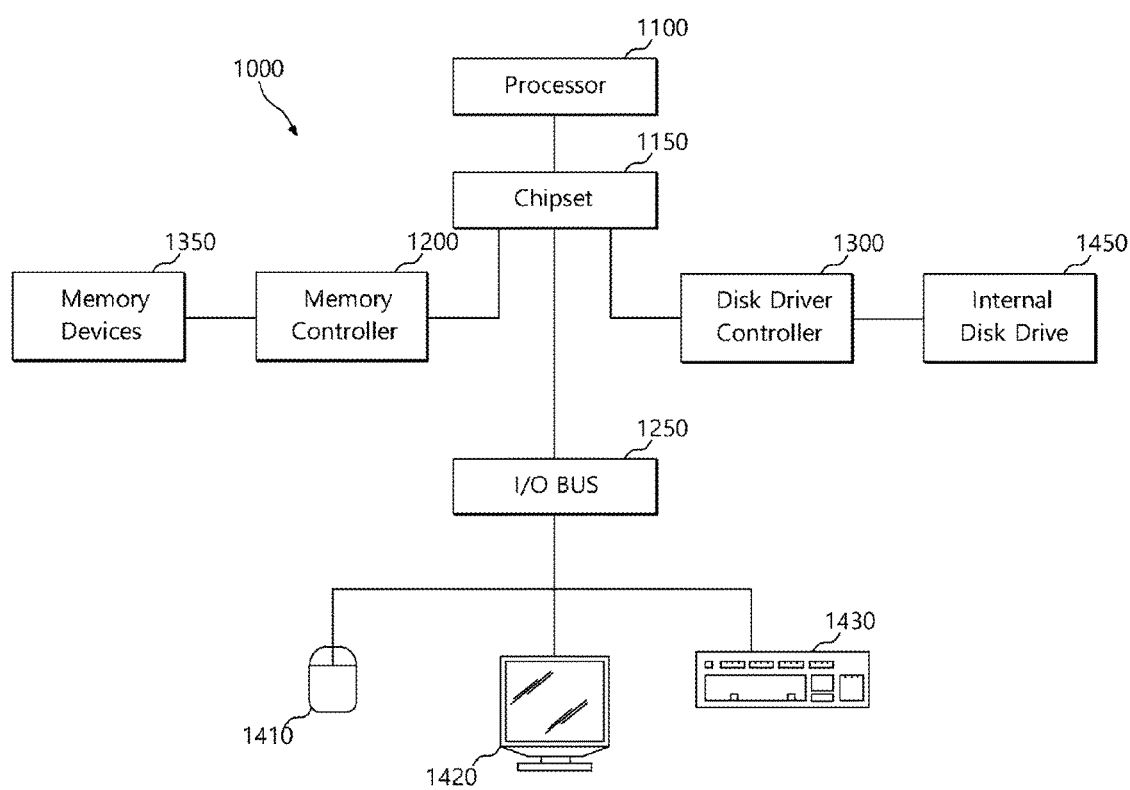
FIG. 6 illustrates a block diagram of an example of a representation of a system employing a semiconductor device and or method of operating the same with the various embodiments discussed above with relation to FIGS. 1-5.

The semiconductor devices as discussed above (see FIGS. 1-5) are particular useful in the design of other memory devices, processors, and computer systems. For example, referring to FIG. 6, a block diagram of a system employing a semiconductor device and or method of operating the same in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device as discussed above with reference to FIGS. 1-5. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device as discussed above with relation to FIGS. 1-5, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 6 is merely one example of a system including a semiconductor device and or method of operating the same as discussed above with relation to FIGS. 1-5. In alternate embodiments, such as, for example but not limited to, cellular phones or digital cameras, the components may differ from the embodiments illustrated in FIG. 6.

The above described embodiments are intended to illustrate and not to limit the disclosure. Various alternatives and equivalents are possible. The disclosure is not limited by the embodiments described herein. Nor are the embodiments limited to any specific type of semiconductor device. Other additions, subtractions, or modifications are obvious in view of the present disclosure and are intended to fall within the scope of the appended claims.

What is claimed is:

1. A semiconductor device comprising:
a boot-up signal generation circuit configured to generate a boot-up signal based on a power-up signal and an end signal;
an oscillating circuit configured to generate an oscillator signal periodically transited based on a dummy boot-up signal and the boot-up signal and a delay oscillator signal generated by delaying the oscillator signal;
a counting circuit configured to generate a counting address, the end signal and the dummy boot-up signal based on the oscillator signal and the power-up signal;
a fuse array configured to output fuse information as fuse data based on the counting address; and
a latch circuit configured to generate a fuse data information signal based on the dummy boot-up signal, the delay oscillator signal and the fuse data.

2. The semiconductor device of claim 1, wherein the boot-up signal generation circuit enables the boot-up signal when the power-up signal is enabled, and the boot-up signal generation circuit disables the boot-up signal when the end signal is enabled.

3. The semiconductor device of claim 1, wherein the oscillating circuit generates the periodically transited oscillator signal when the boot-up signal is enabled, the oscillating circuit delays the oscillator signal to generate the delay oscillator signal, the oscillating circuit generates the oscillator signal having a first frequency when the dummy boot-up signal is enabled, and the oscillating circuit generates the oscillator signal having a second frequency lower than the first frequency when the dummy boot-up signal is disabled.

4. The semiconductor device of claim 3, wherein the oscillating circuit comprises:
an oscillator configured to generate a period signal periodically transited when the boot-up signal is enabled;
a divider circuit configured to generate a divider signal by dividing the period signal;
a selection circuit configured to output any one of the period signal and the divider signal as the oscillator signal based on the dummy boot-up signal; and
a delay circuit configured to output the delay oscillator signal by delaying the oscillator signal.

5. The semiconductor device of claim 4, wherein the divider circuit divides the period signal to generate the divider signal after the power-up signal is enabled.

6. The semiconductor device of claim 1, wherein the counting circuit comprises:
a plurality of counters serially connected with each other;
a dummy boot-up signal generation circuit configured to generate the dummy boot-up signal based on an output signal from a last counter among the counters and the power-up signal; and
an end signal generation circuit configured to generate the end signal based on the dummy boot-up signal.

7. The semiconductor device of claim 6, wherein the end signal generation circuit generates the end signal enabled for a predetermined time when the dummy boot-up signal is disabled.

8. The semiconductor device of claim 1, wherein the counting circuit is configured to define a duration of an enabled dummy boot-up signal by a time elapsed from when the counting circuit initializes an address value of the counting address in response to the power-up signal to when the initialized address value is increased to a specific counting address.

9. The semiconductor device of claim 1, wherein the counting circuit is configured to enable the dummy boot-up signal during a boot-up operation of the semiconductor device for a duration, shorter than a duration of the boot-up operation, after the power-up signal is enabled.

10. The semiconductor device of claim 1, wherein the latch circuit fixes the fuse data information signal to a specific level in an enabled section of the dummy boot-up signal regardless of the fuse data, the latch circuit latches the fuse data, and the latch circuit outputs a latched signal as the fuse data information signal when the dummy boot-up signal is disabled.

11. A method of operating a semiconductor device, the method comprising:
outputting fuse information stored in a fuse array as fuse data during a boot up operation;
latching the fuse data during the boot up operation for a first duration less than an entire duration of the boot up operation; and
fixing a fuse data information signal to a specific level instead of outputting the latched fuse data as the fuse data information signal for a second duration less than an entire duration of the boot up operation,
wherein the first duration is different from the second duration.

12. The method of claim 11,
wherein the boot up operation occurs based on a boot-up signal being enabled, and
wherein the fuse data information signal is fixed to the specific level based on a dummy boot-up signal being enabled, and
wherein the fuse data is latched based on the dummy boot-up signal being disabled.

13. A semiconductor device comprising:
a fuse array configured to output fuse data; and
a latch circuit configured to store the fuse data during an enabled section of a dummy boot-up signal, output the stored fuse data as a fuse data information signal during a disabled section of the dummy boot-up signal, and fix the fuse data information signal to a specific level during the enabled section of the dummy boot-up signal regardless of the stored fuse data.

14. The semiconductor device of claim 13, wherein the latch circuit synchronizes the fuse data information signal with a delay oscillator signal by latching the fuse data based on the delay oscillator signal.

15. The semiconductor device of claim 14, further comprising:
an oscillating circuit configured to generate the delay oscillator signal during a boot up operation of the semiconductor device after a power up signal is enabled by delaying an oscillator signal.

16. The semiconductor device of claim 15, wherein the frequency of the delay oscillator signal is changed based on whether the dummy boot-up signal is enabled or disabled.

17. The semiconductor device of claim 13, wherein the enabled section of the dummy boot-up signal is during a boot up operation of the semiconductor device and has a duration that is less than a duration of the boot up operation.

18. The semiconductor device of claim 13, further comprising:

a counting circuit configured to enable the dummy boot-up signal for a duration after a power up signal is enabled and during a boot up operation of the semiconductor device.

19. The semiconductor device of claim 18, wherein the duration of the enabled dummy boot-up signal is defined by the time elapsed from when the counting circuit initializes an address value of the counting circuit in response to the power up signal to when the initialized address value is increased to a specific counting address.

20. The semiconductor device of claim 13, wherein the fuse data information signal is fixed to a low logic level during the enabled section of the dummy boot-up signal.

* * * * *